United States Patent
Prasad et al.

(10) Patent No.: US 11,756,796 B2
(45) Date of Patent: Sep. 12, 2023

(54) TECHNIQUES FOR IMPROVED LOW DIELECTRIC CONSTANT FILM PROCESSING

(71) Applicant: Applied Materials, Inc., Santa Clara, CA (US)

(72) Inventors: Rajesh Prasad, Lexington, MA (US); Martin Seamons, San Jose, CA (US); Shan Tang, Middleton, MA (US); Qi Gao, Wilmington, MA (US); Deven Raj Mittal, Middleton, MA (US); Kyuha Shim, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 192 days.

(21) Appl. No.: 17/318,843

(22) Filed: May 12, 2021

(65) Prior Publication Data
US 2022/0367205 A1 Nov. 17, 2022

(51) Int. Cl.
*H01L 21/02* (2006.01)
*H01L 21/3115* (2006.01)
*H01L 21/311* (2006.01)

(52) U.S. Cl.
CPC .... *H01L 21/31155* (2013.01); *H01L 21/0234* (2013.01); *H01L 21/02126* (2013.01); *H01L 21/02216* (2013.01); *H01L 21/02321* (2013.01); *H01L 21/31116* (2013.01)

(58) Field of Classification Search
CPC ......... H01L 21/31155; H01L 21/02126; H01L 21/02321; H01L 21/0234; H01L 21/31116; H01L 21/02216
See application file for complete search history.

(56) References Cited

U.S. PATENT DOCUMENTS

| | | | |
|---|---|---|---|
| 11,171,051 B1 * | 11/2021 | Fullam | H01L 21/76877 |
| 2005/0064698 A1 * | 3/2005 | Chang | H01L 21/31633 427/535 |
| 2020/0388531 A1 * | 12/2020 | Sil | H01L 21/76825 |

* cited by examiner

*Primary Examiner* — David Vu
*Assistant Examiner* — Brandon C Fox
(74) *Attorney, Agent, or Firm* — KDW Firm PLLC

(57) ABSTRACT

A method may include providing a substrate having, on a first surface of the substrate, a low dielectric constant layer characterized by a layer thickness. The method may include heating the substrate to a substrate temperature in a range of 200° C. to 550° C.; and directing an ion implant treatment to the low dielectric constant layer, while the substrate temperature is in the range of 200° C. to 550° C. As such, the ion implant treatment may include implanting a low weight ion species, at an ion energy generating an implant depth equal to 40% to 175% of the layer thickness.

19 Claims, 10 Drawing Sheets

TECHNIQUES FOR IMPROVED LOW DIELECTRIC CONSTANT FILM PROCESSING

FIELD

The present embodiments relate to device processing, and more particularly, to improved low dielectric constant layers for electronic devices.

BACKGROUND

In the present day, low permittivity or low dielectric constant (referred to herein as "low k") films are used in device fabrication, such as semiconductor device fabrication, in order to electrically decouple conductive structures from one another. Examples of recently developed low dielectric constant materials include low k CVD (chemical vapor-deposited) layers, including flowable CVD (FCVD) materials, based upon Si, O, C, N, among other elements. For example, FCVD materials may be deposited as layers to fill a three dimensional (3D) structure. During device patterning, treatments such as reactive plasma treatment (ashing) may damage underlying layers, including low k layers. In the case of low k layers, the result of such damage may include increased relative permittivity, increased film leakage and reduced electrical breakdown voltage, among other effects.

With respect to these and other considerations the present disclosure is provided.

BRIEF SUMMARY

In one embodiment, a method may include providing a substrate having, on a first surface of the substrate, a low dielectric constant layer characterized by a layer thickness. The method may include heating the substrate to a substrate temperature in a range of 200° C. to 550° C.; and directing an ion implant treatment to the low dielectric constant layer, while the substrate temperature is in the range of 200° C. to 550° C. As such, the ion implant treatment may include implanting a low weight ion species, at an ion energy generating an implant depth equal to 40% to 175% of the layer thickness.

In another embodiment, a method may include providing a substrate having, on a first surface of the substrate, a low dielectric constant SiOC layer characterized by a layer thickness. The method may include heating the substrate to a substrate temperature in a range of 200° C. to 550° C., and directing a helium ion implant treatment to the low dielectric constant layer, while the substrate temperature is in the range of 200° C. to 550° C., As such, the helium ion implant treatment may include implanting helium ions at an ion dose generating a peak atomic fraction of helium in a range of 0.1% to 10% with respect to elements of the SiOC layer.

In a further embodiment, a method may include providing a substrate having, on a first surface of the substrate, a SiOC layer, characterized by a layer thickness, heating the substrate to a substrate temperature in a range of 200° C. to 550° C., and directing an ion implant treatment to the low dielectric constant layer, while the substrate temperature is in the range of 200° C. to 550° C. The ion implant treatment may include implanting helium ions at an ion energy generating an implant depth equal to 40% to 175% of the layer thickness, and at an ion dose generating a peak atomic fraction of helium in a range of 0.1% to 10% with respect to elements of the SiOC layer.

Figure 1A:
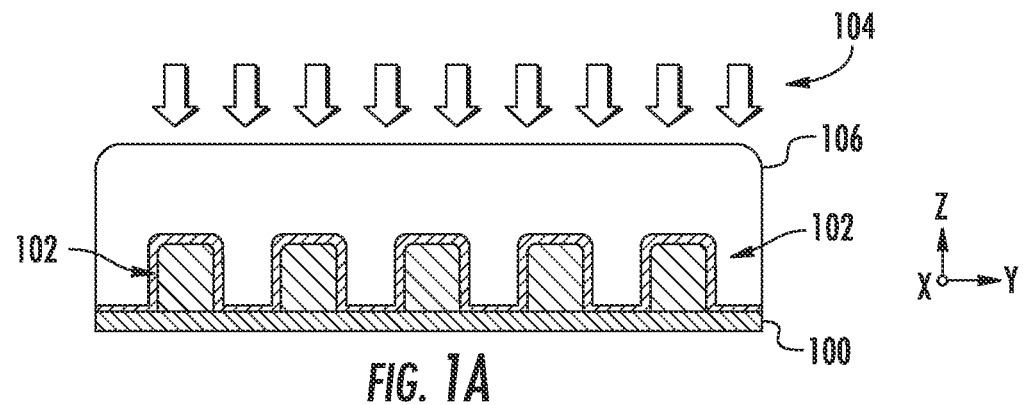
FIG. 1A-1C show exemplary stages of formation of an altered SiOC layer, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

In accordance with some embodiments, novel processing techniques entail implantation of CVD layers, and in particular, low dielectric constant (k) layers formed by CVD. Example low k layers include SiOC layers, or other low dielectric constant layers having carbon as a constituent. As used herein, the term low k layer or low dielectric constant layer may refer to layers having a dielectric constant lower than $SiO_2$, where the dielectric constant is generally in the range of 3.7-4. Moreover, the term low k layer may refer to the property of having a low dielectric constant, as formed, or as-deposited. As detailed in the disclosure to follow, the dielectric constant of "low k layers" may be adversely affected after formation by various treatments, such as ashing treatments.

Figure 1B:
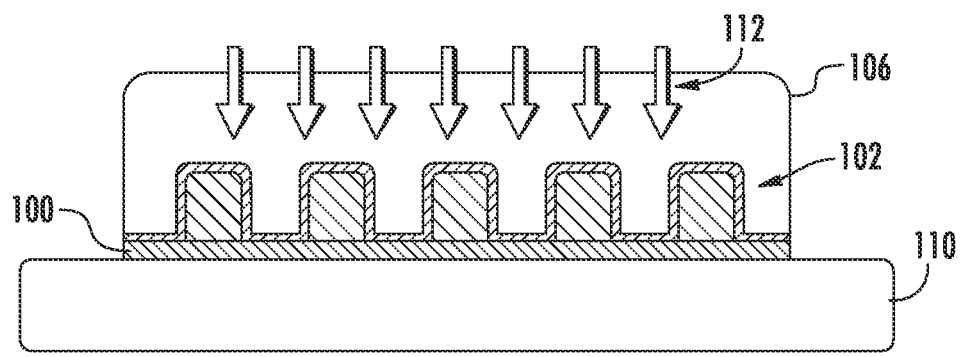
Figure 1C:
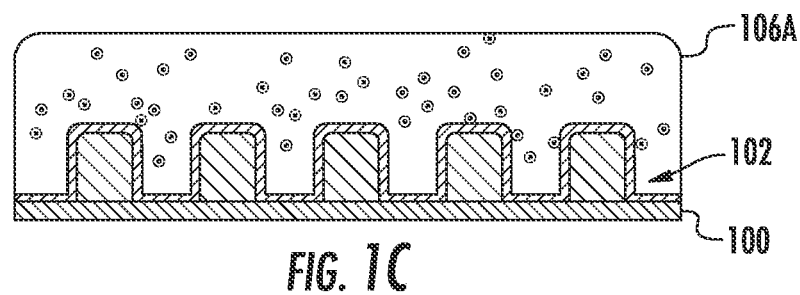

FIGS. 1A-1C depict various stages in formation of an altered low k layer, according to embodiments of the disclosure. The altered low k layer may have various properties that are modified by ion implantation, as detailed below.

In FIG. 1A, a substrate 100 is provided. The substrate 100 may include any number of layers and structures, including device structures. According to various embodiments, the substrate 100 may represent a semiconductor device, such as a logic device or memory device, represented at an intermediate stage of device processing. The substrate 100 may include patterned features 102, where the patterned features 102 are separated from one another, so as to form three-dimensional structures. In some examples, the patterned features 102 may include a metal feature.

Also shown in FIG. 1A is the deposition of a low k layer 106, shown by the arrows that represent a depositing species 104. The low k layer 106 may be formed by a CVD process, such as a known FCVD. In accordance with various embodiments, the low k layer 106 may be based upon SiOC materials or other low K CVD materials that include carbon. The composition of the SiOC layers as discussed herein may be represented as $Si_xC_yO_zH_a$, where x=(10-50%), y=(5-30%), and z=(30-70%) a=(5-35%).

As depicted in FIG. 1A, the low k layer 106 may deposit in a manner to fill regions between patterned features 102. As such, one function of the low k layer 106 may be to decouple adjacent conductive structures from one another. To achieve this decoupling, a useful feature of the low k layer 106 is to retain a low relative permittivity (dielectric constant) after processing is complete. According to some non-limiting embodiments, a useful target of dielectric constant for the low k layer 106 is below 3.5. According to various embodiments, the low k layer 106 may exhibit a dielectric constant below 3, in as-deposited form.

Turning now to FIG. 1B, there is shown a subsequent instance, after the deposition of the low k layer 106. At this stage, the substrate 100 is heated to an elevated temperature. A suitable substrate temperature range according to various non-limiting embodiments is between 200° C. and 550° C. In FIG. 1B, the operation of heating the substrate 100 is depicted by a heater 110. Other suitable components for heating the substrate include radiation sources, or other known heating components.

In FIG. 1B, the further operation of an implant treatment 112 is depicted by the dark arrows. In particular, the implant treatment 112 may be performed while the substrate 100 is heated to the suitable temperature range. According to various embodiments, the implant treatment 112 may be performed by any suitable known ion implantation apparatus including a plasma deposition (PLAD)-type apparatus, used for ion implantation, a beamline ion implanter, or other apparatus.

In various non-limiting embodiment, the implant treatment 112 may involve implanting a low weight ion species into the low k layer 106, such as helium, carbon, nitrogen or silicon ions, while the substrate 100 is heated to a suitable substrate temperature, as discussed above. The ion energy of the low weight ion species that form the implant treatment 112 may be designed to impart a targeted implant depth below the upper surface of the low k layer 106.

In particular embodiments, the ion energy of the low weight ion species for implant treatment 112 may arranged to generate an implant depth equal to 40% to 90% of the layer thickness of the low K layer 106. This range of implant depth corresponds to a situation where a large fraction of ions of the implant treatment 112 will impact the material of the low k layer 106 below the upper surface. Thus, in these embodiments, a large fraction of the ions of the implant treatment 112 will impact the "bulk" of the low k layer 106, meaning regions within the low k layer 106, below the upper surface.

According to various non-limiting embodiments, the ion dose of the implant treatment 112 may be arranged to generate an atomic fraction of the low weight ion species in the range of 0.001% to 10% with respect to the other elemental components of the low k layer 106, in some cases and in some cases between 0.01% and 1%. Notably, this atomic fraction of the low weight ion species may represent the calculated atomic fraction of the low weight ion species based upon the total ion dose of implant treatment 112, and may not represent the retained atomic fraction of low weight ion species after completion of the implant treatment 112. For example, in the case of implantation of helium ions at a 400° C. substrate temperature, a large fraction of the initially-implanted helium ions may diffuse out of the low k layer 106.

Turning now to FIG. 1C, there is shown the low k layer 106 after implant treatment 112 has been completed. At this instance, the substrate 100 may be returned to room temperature, and may be in condition for further processing. At this stage, the low k layer 106 is depicted as altered layer 106A. As discussed with respect to the figures to follow, the implant treatment 112 may impart beneficial properties to the altered layer 106A, in comparison to those properties exhibited by the low k layer 106, absent the implant treatment 112. In particular, as detailed below, these beneficial properties may exhibit themselves after further substrate processing takes place.

Examples

In a series of experiments, SiOC layers were deposited on test substrates by an FCVD process.

Known FCVD processes suitable for the present embodiments may involve a remote plasma providing a flow of radicals through the dual channel showerhead, which radicals then react with precursors in the processing regime where the substrate is present. Additionally, an FCVD process may involve a low power direct plasma process with the radicals created in the plasma in the same volume as the precursor introduction. In the case of a remote plasma, processing conditions may range between 0.1 Torr to 5.0 Torr, with a showerhead-to-wafer distance of 200 mils to 5000 mils (3000 mils being commonly employed). The substrate temperature may range between 10° C.-150° C., radical gas flow of 100 sccm to 10000 sccm, precursor flow of 10 sccm to 5000 sccm, or in the case of liquid injection 100 mgm to 10000 mgm with carrier gas in the flow of 100 sccm to 10000 sccm. After deposition, the composition of the "SiOC" FCVD layer includes hydrogen as an element, in addition to silicon, oxygen, and carbon. In the present examples the FCVD process parameters were: a substrate temperature of 80° C. was used, a pressure of 2 Torr, 3400 mils, 2000 mgm TEOS, 620 sccm $O_2$, 1500 sccm Ar-Carrier for TEOS, 350 sccm Ar, 150 mgm TMOS, 300 sccm Ar-carrier for TMOS per pedestal 200 W power.

After deposition, the test substrates with deposited SiOC layers were subjected to various intervening treatments, detailed below, before being exposed to an ashing process that is characteristically used as part of device patterning processes after FCVD deposition. The following figures present measurement data taken after the test substrates were subject to the ashing process. Suitable ashing processes according to some non-limiting embodiments of the disclosure may use any oxygen- or hydrogen-containing gas such as $O_2$, $N_2O$, CO, $CO_2$, $H_2$, $H_2O$, $NH_3$ etc. In some variants, He, Ar or $N_2$ may be present in the ashing ambient. Ashing may take place within a plasma chamber, or by using species derived from a remote plasma. In various embodiments, the substrate temperature may range between 10° C. up to 300° C., with chamber pressure between 5 mTorr up to 10 Torr. Table I provides exemplary ashing conditions.

TABLE I

Exemplary Ashing Treatments Performed after SiOC deposition

| Ashing Condition | Chamber type | Chemistry | Source | Temperature (° C.) |
|---|---|---|---|---|
| Condition A | Ashing | $N_2/H_2$ | RPS | 280 |
| Condition B | Dielectric Etch | $N_2/H_2$ | CCP | <100 |
| Condition C | Dielectric Etch | $CO_2/CO$ | CCP | <100 |
| Condition D | Conductor Etch | $He/H_2$ | ICP | <100 |

FIGS. 2-7 present results of device measurement after SiOC layer deposition and ashing treatment, where various intervening treatments were performed after SiOC deposition and before ashing treatment. For the data shown in FIGS. 2-7, in all cases where ion implantation was performed, the implanting species was helium ions. In a brief summary of the results of FIGS. 2-7, untreated SiOC layers generally exhibited much worse dielectric constant values and leakage values after ashing, while breakdown voltage was not substantially affected. SiOC layers subjected to high temperature annealing before ashing similarly showed much worse dielectric constant values and leakage values after ashing, while breakdown voltage was not substantially affected. SiOC layers subjected to ion implantation at room temperature before ashing similarly showed much worse dielectric constant values, leakage values, and breakdown voltage values after ashing. In spite of the worsening performance inducted by heating substrates or implanting the substrates before ashing, when helium implantation of SiOC layers was performed at high temperature before ashing, dielectric constant values, leakage values, and breakdown voltage values after ashing were all substantially better than corresponding values for untreated SiOC layers.

Figure 2:
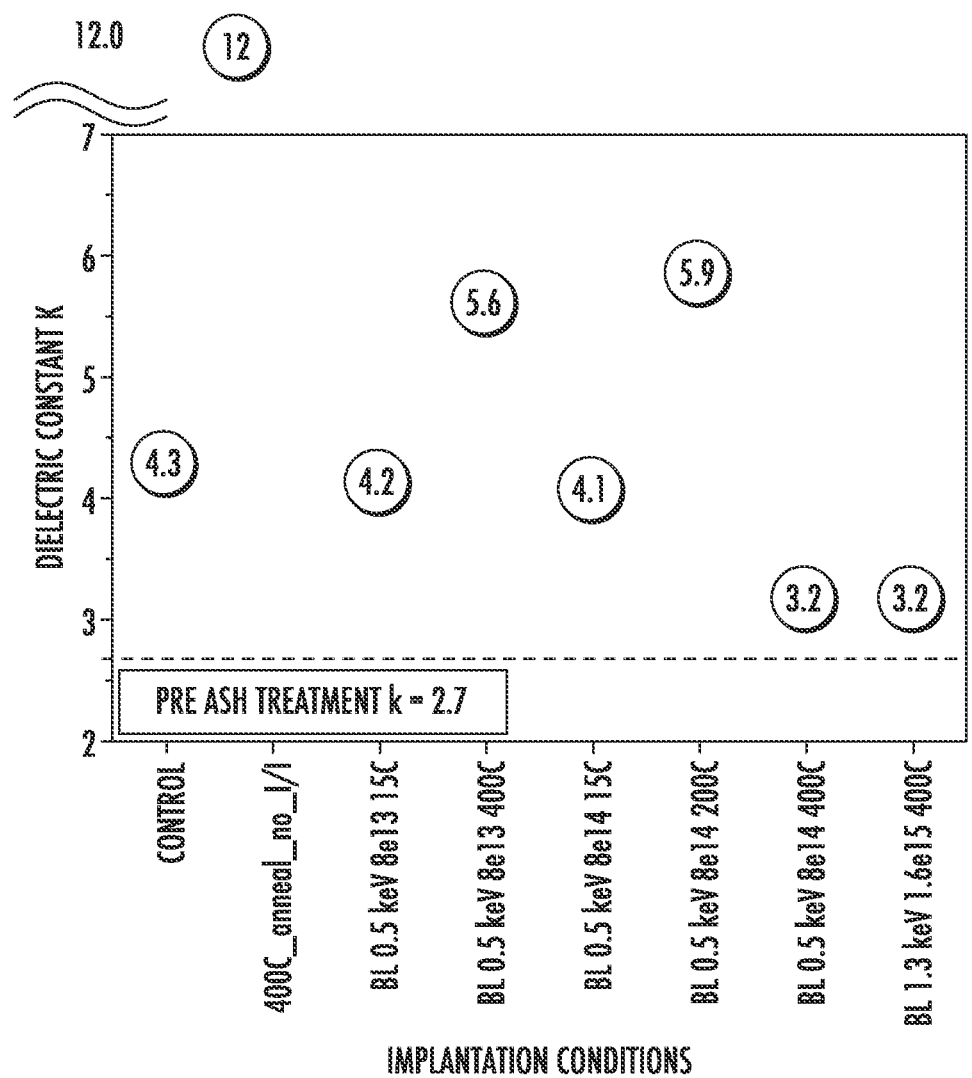
FIG. 2 presents a graph depicting dielectric constant data for SiOC layers subject to ion implantation according to some embodiments of the disclosure.

FIG. 2 presents a graph depicting dielectric constant data for test substrates having SiOC layers subject to different intervening treatments, including helium ion implantation treatment performed according to some embodiments of the disclosure. Before being exposed to any intervening treatment and subsequent ashing process, the dielectric constant of the FCVD layer was measured at a value of 2.7, as indicated by the horizontal dashed line.

A control test substrate was subjected to no intervening treatment after FCVD deposition of the SiOC layer. In this example, when ashing was performed after the SiOC layer was deposited, the dielectric constant increased to a value of 4.3 (from the initial value of 2.7), as shown in FIG. 2.

A separate test substrate was subjected to a high temperature annealing treatment, at 400° C., with no ion implantation. The high temperature annealing treatment was performed after deposition of the FCVD layer and before ashing. In this example, as further shown in FIG. 2, the dielectric constant increased to a value of 12 (from the initial value of 2.7) after ashing was performed. Thus, subjecting the FCVD layer to high temperature annealing before ashing resulted in an even worse (higher) value of dielectric constant after ashing.

A separate test substrate was subjected to ion implantation at room temperature (15 C), using a beamline ion implanter to implant helium ions at an ion energy of 500 eV. The ion dose of helium was such that the peak atomic fraction of implanted He compared to the elements of the FCVD layer was 0.1% or 8 E13/$cm^2$ ion dose. The room temperature ion implantation was performed after deposition of the FCVD layer and before ashing. In this example, as further shown in FIG. 2, the dielectric constant increased to a value of 4.2 (from the initial value of 2.7) after ashing was performed.

A separate test substrate was subjected to ion implantation at room temperature (15° C.), using a beamline ion implanter to implant helium ions at an ion energy of 500 eV and ion dose of 8 E14/$cm^2$ ion dose. The room temperature ion implantation was performed after deposition of the FCVD layer and before ashing. In this example, as further shown in FIG. 2, the dielectric constant increased to a value of 4.1 (from the initial value of 2.7) after ashing was performed.

As further shown in FIG. 2, separate test substrates were subjected to ion implantation at elevated temperature using a beamline ion implanter to implant helium ions at an ion energy of 500 eV. As with other tests, the ion implantation was performed after deposition of the FCVD layer and before ashing. When substrate temperature was increased to 400 C and ion dose was 8 E13/$cm^2$, the dielectric constant increased to a value of 5.6 (from the initial value of 2.7) after ashing was performed. Moreover, when substrate temperature was increased to 200 C and ion dose was 8 E14/$cm^2$, the dielectric constant increased to a value of 5.9 (from the initial value of 2.7) after ashing was performed.

A separate set of tests were performed where the test substrate was subjected to ion implantation at a temperature of 400° C., using a beamline ion implanter to implant helium ions at a relatively higher ion dose. As with the other examples, the 400° C. ion implantation was performed after deposition of the FCVD layer and before ashing. In one experiment, at a substrate temperature of 400° C., the helium ion energy was 500 eV and implant dose 8 E14/$cm^2$, equivalent to a peak atomic volume concentration of 1%. As shown in FIG. 2, the dielectric constant increased to a value of just 3.2 (from the initial value of 2.7) after ashing was performed.

In another experiment, again conducted at a substrate temperature of 400° C., the helium ion energy was increased to 1300 eV and ion dose increased to 1.6 E15/$cm^2$, with a resultant peak atomic volume concentration again of 1%. The 400° C. ion implantation was performed after deposition of the FCVD layer and before ashing. In this example, as further shown in FIG. 2, the dielectric constant also increased to a value of just 3.2 (from the initial value of 2.7) after ashing was performed. In sum, the results summarized in FIG. 2 illustrate that subjecting an FCVD SiOC layer to beamline ion implantation by itself or the increased temperature by itself causes dielectric constant to increase substantially after ashing, while implanting He ions to a given peak atomic concentration into a heated SiOC layer is effective in maintaining a relatively lower dielectric constant in the layer after ashing.

Figure 3:
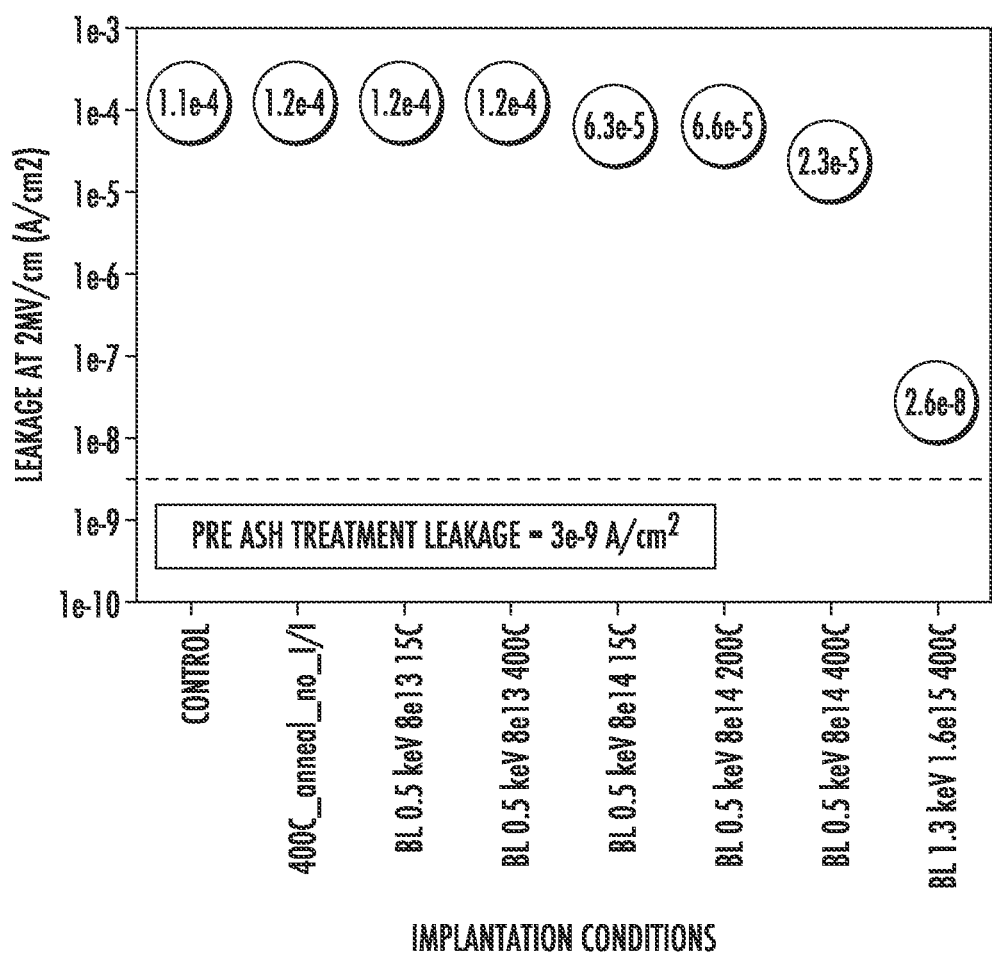
FIG. 3 presents a graph depicting leakage data for SiOC layers subject to ion implantation according to some embodiments of the disclosure.

FIG. 3 presents a graph depicting leakage data for SiOC layers subject to ion implantation according to some embodiments of the disclosure. The different samples shown in FIG. 3, and labeled along the X-axis, correspond to the same samples as in FIG. 3, described above. Before being exposed to any intervening treatment and subsequent ashing process, the leakage value of the FCVD layer was measured at a value of $3 \times 10^{-9}$ (the values in FIG. 3 were measured at an electric field of 2 MV/cm and are shown in units of A/cm$^2$), as indicated by the horizontal dashed line.

Figure 4:
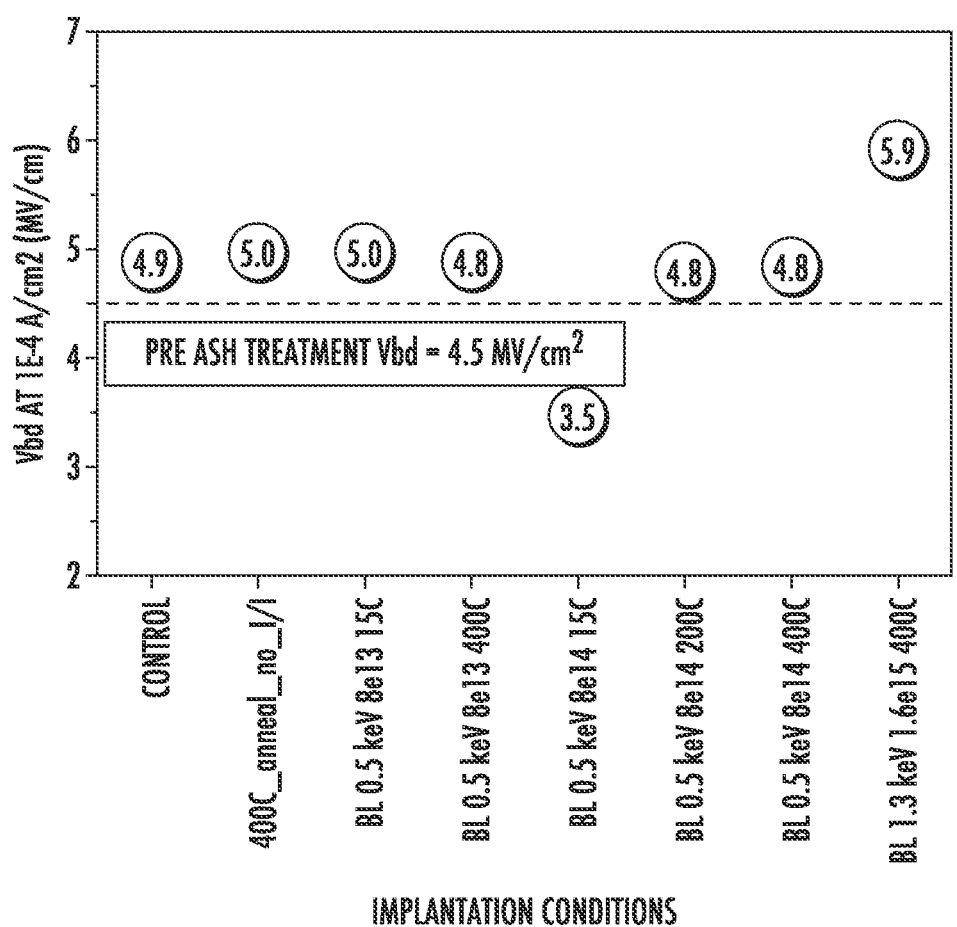
FIG. 4 presents a graph depicting breakdown voltage data for SiOC layers subject to ion implantation according to some embodiments of the disclosure.

As noted above, the control test substrate was subjected to no intervening treatment after FCVD deposition of the SiOC layer. In this example, when ashing was performed after the SiOC layer was deposited, the leakage increased dramatically to a value of $1.1 \times 10^{-4}$ (from the initial value of $3 \times 10^{-9}$), as shown in FIG. 4.

A separate test substrate was subjected to a high temperature annealing treatment, at 400° C., with no ion implantation, as discussed with respect to FIG. 3. The high temperature annealing treatment was performed after deposition of the FCVD layer and before ashing. In this example, as further shown in FIG. 3, the leakage increased to a value of $1.2 \times 10^{-4}$ (from the initial value of $3 \times 10^{-9}$) after ashing was performed, similar to the value of the control sample. Thus, high temperature annealing of the FCVD layer before ashing was ineffective in preventing a dramatic increase in leakage, induced after ashing.

A set of separate test substrates were subjected to ion implantation at room temperature, using a beamline ion implanter to implant helium ions at an ion energy of 500 eV. As noted above, the ion dose of helium in two different experiments was such that the peak atomic fraction of implanted He compared to the elements of the FCVD layer was 1% (8 E14/cm$^2$ dose) as well as 0.1% (8 E13/cm$^2$ ion dose). The room temperature ion implantation was performed after deposition of the FCVD layer and before ashing. In these examples, as further shown in FIG. 3, the leakage increased to a value of $6.3 \times 10^{-5}$ for 8 E14/cm$^2$ ion dose and 1.2 E-4 for 8 E13/cm$^2$ ion dose (from the initial value of $3 \times 10^{-9}$) after ashing was performed. Thus, room temperature He ion implantation of the FCVD layer before ashing was ineffective in preventing a dramatic increase in leakage, induced after ashing.

As further shown in FIG. 3, SiOC layers heated to 200° C. and subjected to implantation at 500 eV 8 E14/cm$^2$ ion dose also exhibit a dramatic increase in leakage to a value of 6.6 E-5 after ashing. As further shown in FIG. 3, SiOC layers heated to 400° C. and subject to implantation at 500 eV 8 E14/cm$^2$ ion dose also exhibit an increase in leakage to a slightly lower value of 2.3 E-5 after ashing, somewhat less than for implantation at 15 C or 200° C. at a comparable ion dose.

As further shown in FIG. 3, when implantation into SiOC layers heated to 400 C was performed with helium ion energy increased to 1300 eV and ion dose increased to 1.6 E15/cm$^2$, the increase in leakage in this case after ashing is held to a much lower value of 2.3 E-5.

In summary, the results of FIG. 3 show that, with respect to the control sample (untreated SiOC layers), where ashing causes a dramatic increase in leakage, samples subjected to ion implantation at relatively lower ion dose (8 E13/cm$^2$) in the temperature range of 15° C. to 400° C. did not reduce the post-ashing leakage increase. Moreover, ion implantation at moderate ion dose (8 E14/cm$^2$) in the temperature range of 15° C. to 400° C. reduced the post-ashing leakage increase just slightly, moreso at 400° C. While ion implantation at relatively higher ion dose (1.6 E15/cm$^2$) at 400° C. was effective in dramatically reducing the increase in leakage caused by the ashing.

FIG. 4 presents a graph depicting breakdown voltage data for SiOC layers subject to ion implantation according to some embodiments of the disclosure. The different samples shown in FIG. 4, and labeled along the X-axis, correspond to the same samples as in FIG. 2 and FIG. 3, described above. Before being exposed to any intervening treatment and subsequent ashing process, the breakdown voltage value of the FCVD layer, measured at a current density of 1 $E^{-4}$ A/cm$^2$ was 4.5 MV/cm, as indicated by the horizontal dashed line.

Figure 5:
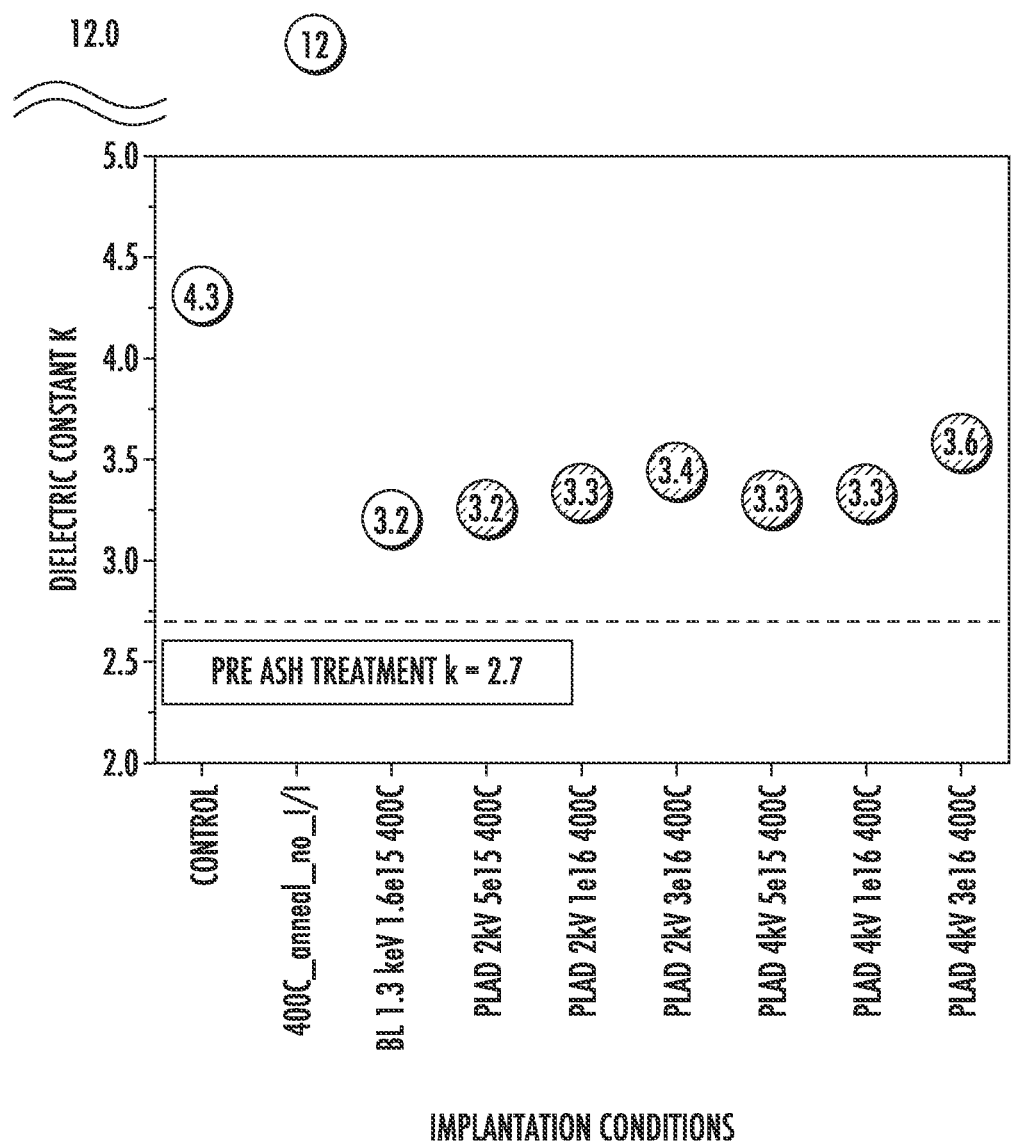
FIG. 5 presents a graph depicting dielectric constant data for SiOC layers subject to ion implantation according to additional embodiments of the disclosure.

As noted above, the control test substrate was subjected to no intervening treatment after FCVD deposition of the SiOC layer. In this example, when ashing was performed after the SiOC layer was deposited, the breakdown voltage value of the FCVD layer improved slightly, increasing to a value of 4.9 MV/cm (from the initial value of 4.5 MV/cm), as shown in FIG. 5. Thus, the ashing process alone does not appear to reduce breakdown voltage.

A separate test substrate was subjected to a high temperature annealing treatment, at 400° C., with no ion implantation, as discussed with respect to FIG. 2 and FIG. 3. The high temperature annealing treatment was performed after deposition of the FCVD layer and before ashing. In this example, as further shown in FIG. 4, the breakdown voltage increased to a value of 5 MV/cm (from the initial value 4.5 MV/cm) after ashing was performed, similar to the value of the control sample. Thus, high temperature annealing of the FCVD layer before ashing did not appear to change the effect on breakdown voltage induced by ashing.

A set of separate test substrates were subjected to ion implantation at room temperature, using a beamline ion implanter to implant helium ions at an ion energy of 500 eV. As noted above, the ion dose of helium in two different experiments was such that the peak atomic fraction of implanted He compared to the elements of the FCVD layer was 1% (8 E14/cm$^2$ dose) as well as 0.1% (8 E13/cm$^2$ ion dose). The room temperature ion implantation was performed after deposition of the FCVD layer and before ashing. In these examples, as further shown in FIG. 4, the breakdown voltage for ion dose of 8 E14/cm$^2$ ion dose decreased to a value of 3.5 (from the initial value of 4.5) after ashing was performed, while the breakdown voltage increased to a value of 5.0 for a lower ion dose of 8 E13/cm$^2$.

A separate test substrate was implanted at 200° C. with 500 eV He ions to a dose of 8 E13/cm$^2$ with the resulting breakdown voltage increasing to a value of 4.8 after ashing. Separate test substrates were subjected to ion implantation at a substrate temperature of 400° C., using a beamline ion implanter to implant helium ions at a dose ranging from 8 E13/cm$^2$ ion dose to 8 E14/cm$^2$ to 1.6 E15/cm$^2$. At the lower two ion doses breakdown voltage increases marginally to 4.8 V, while at the highest ion dose, the breakdown voltage increases to 5.9 V.

In sum, with respect to performing no treatment before ashing, most of the post formation treatments of the SiOC FCVD layers have a marginal effect on breakdown voltage, showing either a marginal decrease or marginal increase. Just at the highest ion dose and 400° C. does breakdown voltage significantly improve.

Based upon the above results, further implantation experiments were conducted using a PLAD tool, where helium ions were extracted from a plasma to implant into the SiOC layer before ashing. The results of these further experiments are provided as dielectric constant measurements, leakage measurements, and breakdown voltage measurements, shown in FIGS. 5, 6, and 7, respectively.

FIG. 5 shows dielectric constant as a function of PLAD conditions, and includes the aforementioned control condition as well as 400° C. annealing condition without implantation, as described with respect to FIGS. 2-4. For comparison purposes, the "best" beam line He implantation result is shown, as described above. This beamline condition was an ion energy of 1.3 keV, ion dose of 1.6 E15/cm$^2$, and substrate temperature of 400° C.

In FIG. 5, the PLAD ion implantation experiments were all performed at a substrate temperature of 400° C. Three different experiments were performed where helium ions were implanted at a platen bias of 2 kV ion energy, while three more experiments were performed where helium ions were implanted at a platen bias of 4 kV. At the two different ion energies, the ion dose was varied from 5 E15/cm$^2$ to 1 E16/cm$^2$ to 3 E16/cm$^2$. As shown in FIG. 5, the 400° C. ion implantation of helium attenuates the effect of ashing on increasing the dielectric constant of the FCVD SiOC layers. Said differently, with respect to the control sample or the annealed sample without implantation, 400° C. He implantation reduces the final dielectric constant after ashing. For a given platen bias, the lowest ion dose (5e15/cm$^2$) appears to be the most effective in maintaining a low dielectric constant, while the implantation of He at the lower platen bias also results in a slightly lower dielectric constant for a given implant dose.

Figure 6:
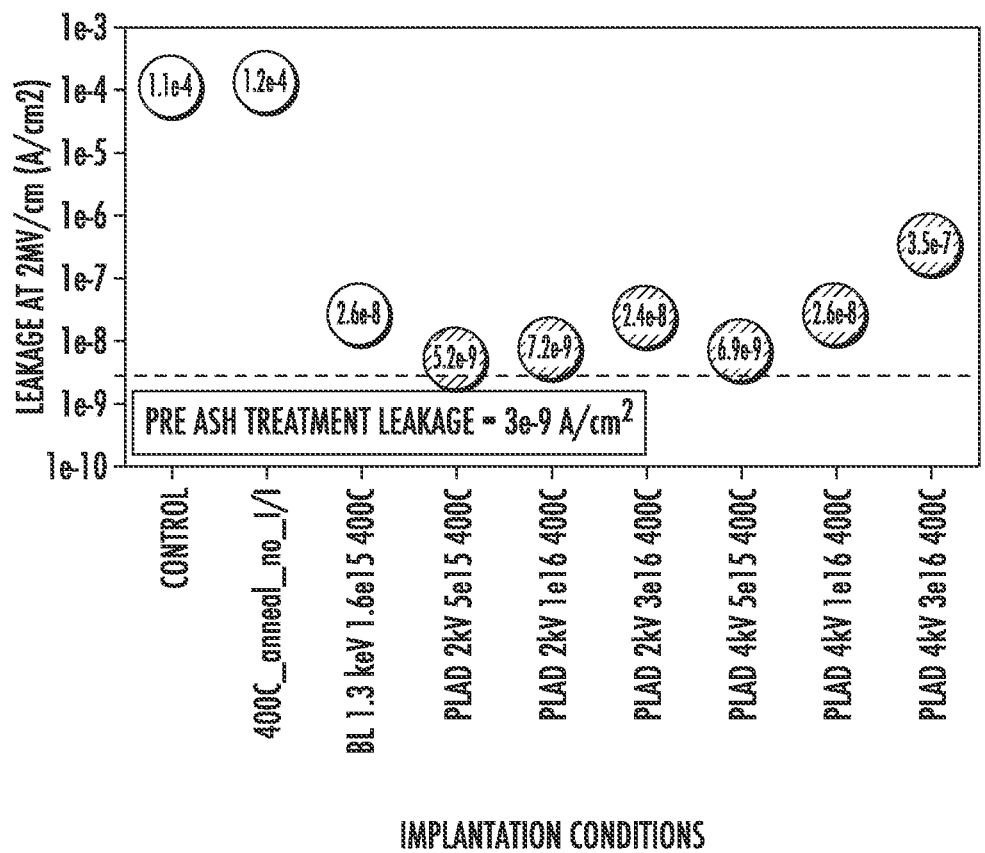
FIG. 6 presents a graph depicting leakage data for SiOC layers subject to ion implantation according to additional embodiments of the disclosure.

FIG. 6 shows leakage as a function of PLAD conditions, and includes the same conditions as in FIG. 5, described above. For comparison purposes, the "best" beam line He implantation result is shown, as described above. This beamline condition was an ion energy of 1.3 keV, ion dose of 1.6 E15/cm$^2$, and substrate temperature of 400° C.

In summary, PLAD helium ion implantation at 400° C. is effective in reducing the otherwise large leakage increase induced by ashing, as exhibited by the control sample, where leakage increases from 3 $E^{-9}$ before ashing to 1.1 $E^{-4}$ after ashing. In particular, implantation at the lowest ion dose (5 E15/cm$^2$) is the most effective in maintaining leakage at levels closest to the pre-ashing value, for both 2 kV and 4 kV. In these substrates, the leakage just increased slightly to 5.2 $E^{-9}$ and 6.9 $E^{-9}$, respectively, after ashing. As with the trends of the dielectric constant results, increases in ion dose for a given ion energy result in increases in leakage. At the higher ion doses and higher ion energy, the leakage increases more significantly, while still being much lower than in the control samples.

Figure 7:
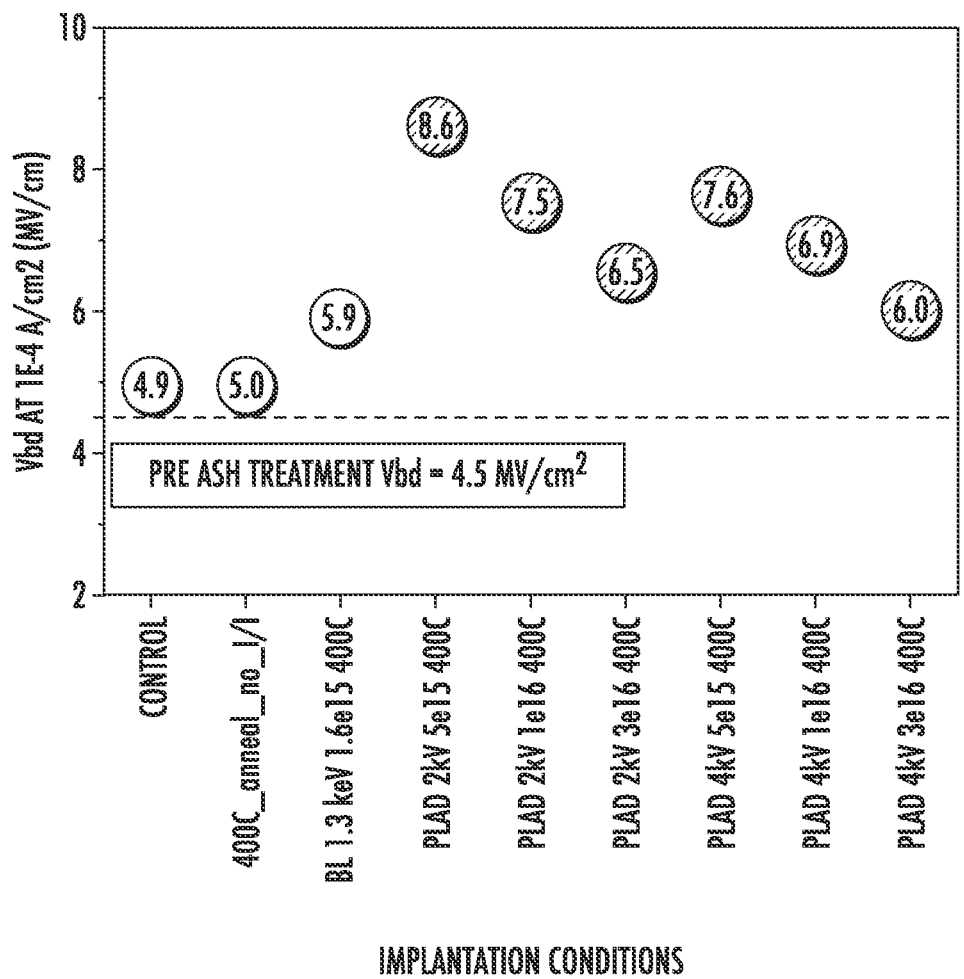
FIG. 7 presents a graph depicting breakdown voltage data for SiOC layers subject to ion implantation according to additional embodiments of the disclosure.

FIG. 7 shows breakdown voltage as a function of PLAD conditions, and includes the same conditions as in FIG. 5, FIG. 6, described above. For comparison purposes, the "best" beam line He implantation result is shown, as described above. This beamline condition was an ion energy of 1.3 keV, ion dose of 1.6 E15/cm$^2$, and substrate temperature of 400° C.

In summary, PLAD helium ion implantation at 400° C. is effective in increasing breakdown voltage after ashing, with respect to the untreated control sample, where breakdown voltage after ashing remains similar to the value before ashing. The trends observed in FIGS. 6 and 7 are also present in the breakdown voltage results. In this case, implantation at lower (2 kV bias) compared to 4 kV bias results in higher breakdown voltage. Again, the best result is achieved at the lowest ion dose of 5e15/cm$^2$, with decreasing breakdown voltage as a function of increasing ion dose. As further shown in FIG. 7, the best PLAD condition for achieving the highest breakdown voltage occurs at a platen bias of 2 kV and ion dose of 5e15/cm$^2$, yielding a breakdown voltage of 8.6 MV/cm, which result is higher than the best beam line He condition of 5.9 MV/cm.

Figure 8:
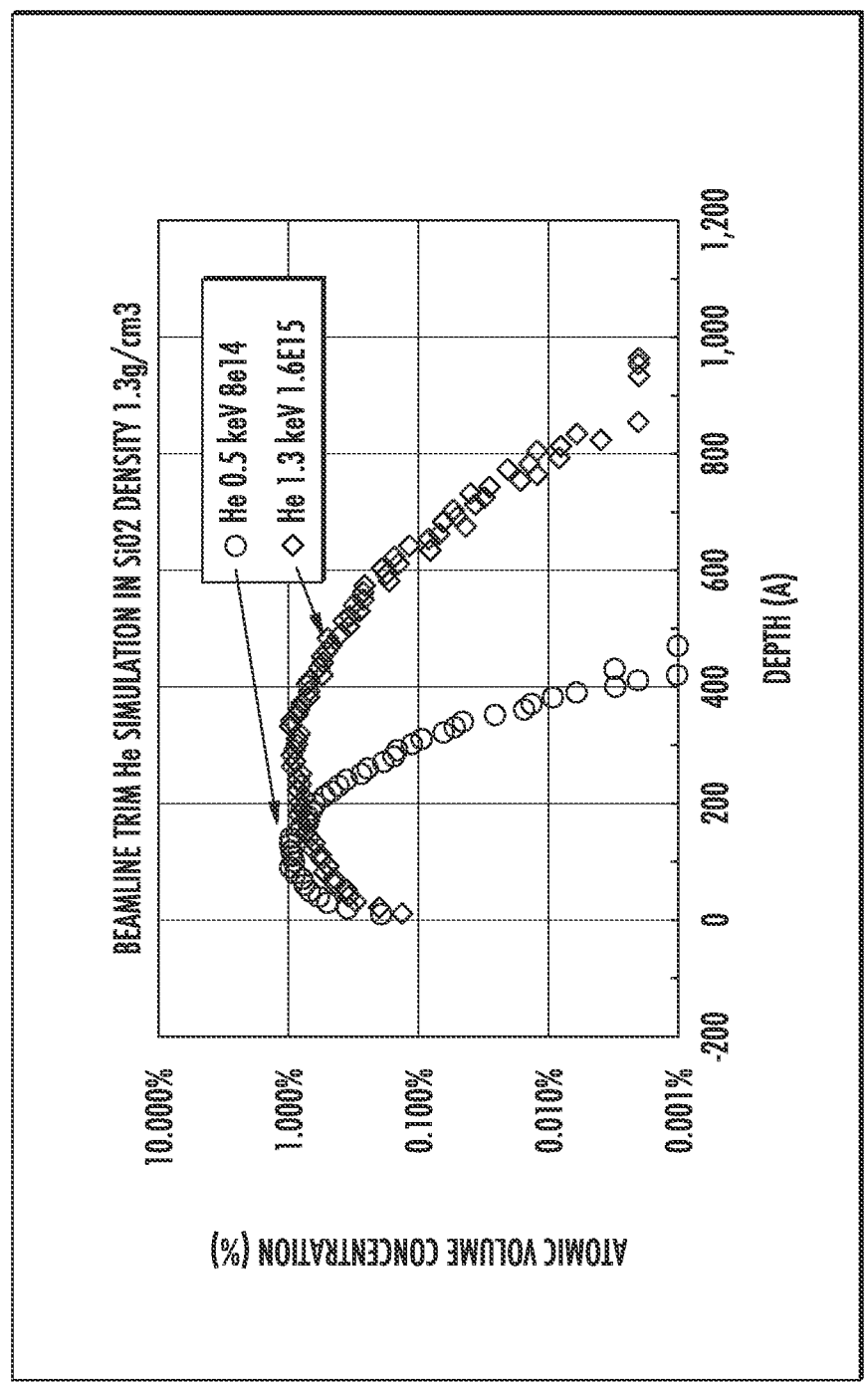
FIG. 8 presents the results of TRIM simulation data, for He implantation at 500 eV and 1.3 keV.

In the examples of FIGS. 2-7, the nominal layer thickness for the deposited SiOC layer was 1000 Å. To place the above results in context, FIG. 8 presents the results of TRIM simulation data, for He implantation at 500 eV and 1.3 keV. The TRIM simulation uses SiO$_2$ material as a proxy for the SiOC layer implanted in actual experiments, and uses a density of 1.3 g/cm$^3$. In the example shown for a 1000 Å film thickness, in order to achieve 1% atomic volume concentration, the dose needs to be adjusted for the different energies. The simulated data results in a 1% atomic volume peak concentration of helium for both ion energies, given an ion dose of 8 E14/cm$^2$ at the lower ion energy, and an ion dose of 1.6 E15/cm$^2$ at the higher ion energy.

Based upon the results of FIG. 2, where dielectric constant improves markedly at both ion energies shown in FIG. 8, these results suggest that high temperature implantation of He to an implant depth between 40% to 90% of the FCVD layer thickness, and at a peak atomic concentration in the range of 1% will be effective in improving post-ashing layer properties, where the implant depth is defined as a concentration of 0.001% as shown in FIG. 8.

Moreover, in the context of FIG. 8, an ion dose of 8 E13/cm$^2$ at 500 eV will yield a peak atomic He concentration of 0.1%. Referring again to FIG. 2-4, the results shown therein illustrate that implantation of He under 8 E13/cm$^2$ at 500 eV, and thus under conditions yielding a peak He atomic fraction of 0.1% does not improve layer properties. Thus, the threshold in peak He atomic concentration for generating clear improvement in layer properties may be above 0.1%. While the above results show a peak He atomic concentration of 1% to be effective, implanting He to higher peak He concentrations up to 10% may be equally effective or at least partially effective in improving layer properties, while requiring a higher ion dose.

In addition, as suggested by the results of FIGS. 5-7, implantation at ion energies where implant depth may exceed the layer thickness (see 2 kV and 4 kV He PLAD results) may further improve FCVD layer properties after ashing. In other words, implanting He ions or other low-mass ions to a depth of 130%, 150% or 175% may engender further benefit to layer properties, as evidenced by the trend when increasing He energy from He 0.5 keV (40%) to He 1.3 keV (90%). Notably, while the implant depth for PLAD He implantation was not modeled, based upon the higher voltage of 2 kV and 4 kV, the implant depth in these experiments may well exceed 100% of the layer thickness, since 1.3 keV beamline implantation generated an implant depth equivalent to 90% of the 1000 Å SiOC layer. For example, a TRIM calculation would suggest He ion energies of 2 keV and 4 keV correspond to implant depths of 1249 Å, and 2333 Å, respectively. Note that this implant depth is the depth where He concentration is 0.001%, while the peak He concentration is much closer to the layer surface. Thus, the improved results exhibited by the layers subjected to 2 kV or 4 kV PLAD He implantation are suggestive that implant depths beyond 100% of the SiOC layer thickness indeed may improve layer properties.

While the above results show that high temperature implantation of helium ions to a particular implant depth and peak concentration improves FCVD SiOC layer properties after ashing, other low mass ions may be suitable to achieve similar results. For example, implantation of C into SiO$_2$ layers has been observed to reduce dielectric constant. Other low mass ions including Si, which species is already a large component of the SiOC layer, as well as N, may also be effective to reduce the degradation of dielectric constant induced by ashing. Without limitation to any particular theory, the adjustments to the chemical composition make-up of the low k layer induced by low mass implantation at the elevated temperature may make the low-k layer less sensitive to the subsequent ashing processes.

Figure 9:
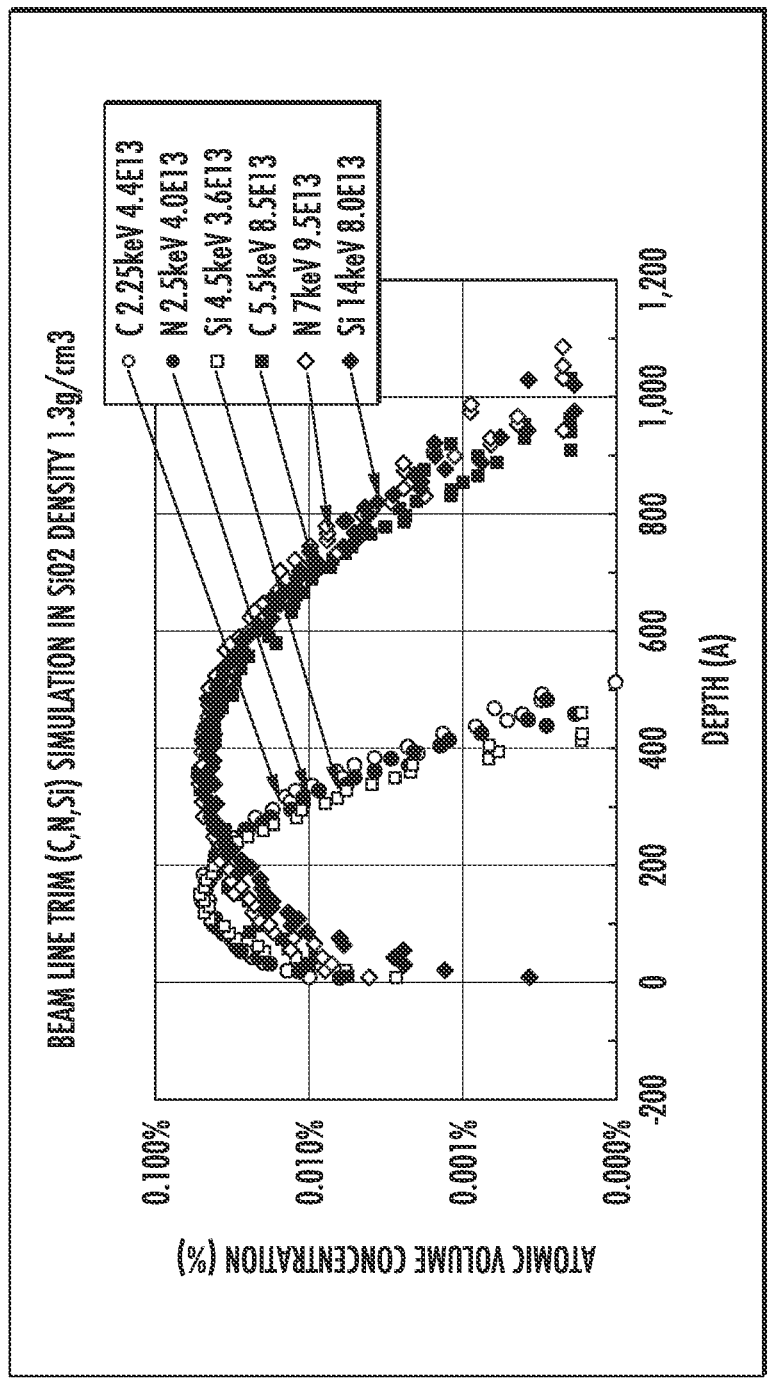
FIG. 9 presents the results of TRIM simulation data, for carbon, nitrogen and silicon ions implanted into $SiO_2$ with a density of 1.3 $g/cm^3$ as a proxy to an SiOC film.

FIG. 9 presents the results of TRIM simulation data, for carbon, nitrogen and silicon ions implanted into $SiO_2$ with a density of 1.3 $g/cm^3$ as a proxy to an SiOC film. The simulation conditions are chosen to place the implant depth of the various ion species to similar depths as achieved by 500 eV He and 1.3 keV He ions, as detailed above. As shown, the ion energy to achieve a given implant depth increases with ion mass. For example, in order to treat close to 1000 A thickness of an SiOC layer, an energy of 14 keV is needed in the case of silicon ions.

In summary, for the beamline ion implantation condition represented in the preceding FIGS. (500 eV and 1.3 keV), the implant depth corresponds to between approximately 40% to 90% of the nominal layer thickness. Thus, high temperature implantation of He to an implant depth approximately 40% to 90% is effective in reducing or eliminating the deleterious effects of subsequent ashing on properties including dielectric constant, leakage, and breakdown voltage, with implant depth of 90% being more effective. Moreover, the results of the PLAD He ion implant experiments suggest that ion energies (such as 2 keV to 4 keV) that generate an implant depth that may slightly exceed layer thickness may still be very effective in improving layer properties after ashing.

While He implantation at substrate temperatures in the range close to 400° C. rather than 200° C. is clearly effective, the above results suggest that increasing substrate temperature during implantation to temperatures in the range of 500° C. to 600° C. may also be effective, at least for improving some layer properties. However, increasing substrate temperature for implantation beyond this temperature range may not be compatible with other device processing considerations. Similarly, increasing ion energy to place the implant depth substantially beyond the layer thickness of the FCVD layer being implanted may also be limited by other device considerations, such as limiting ion penetration into underlying device regions.

Figure 10:
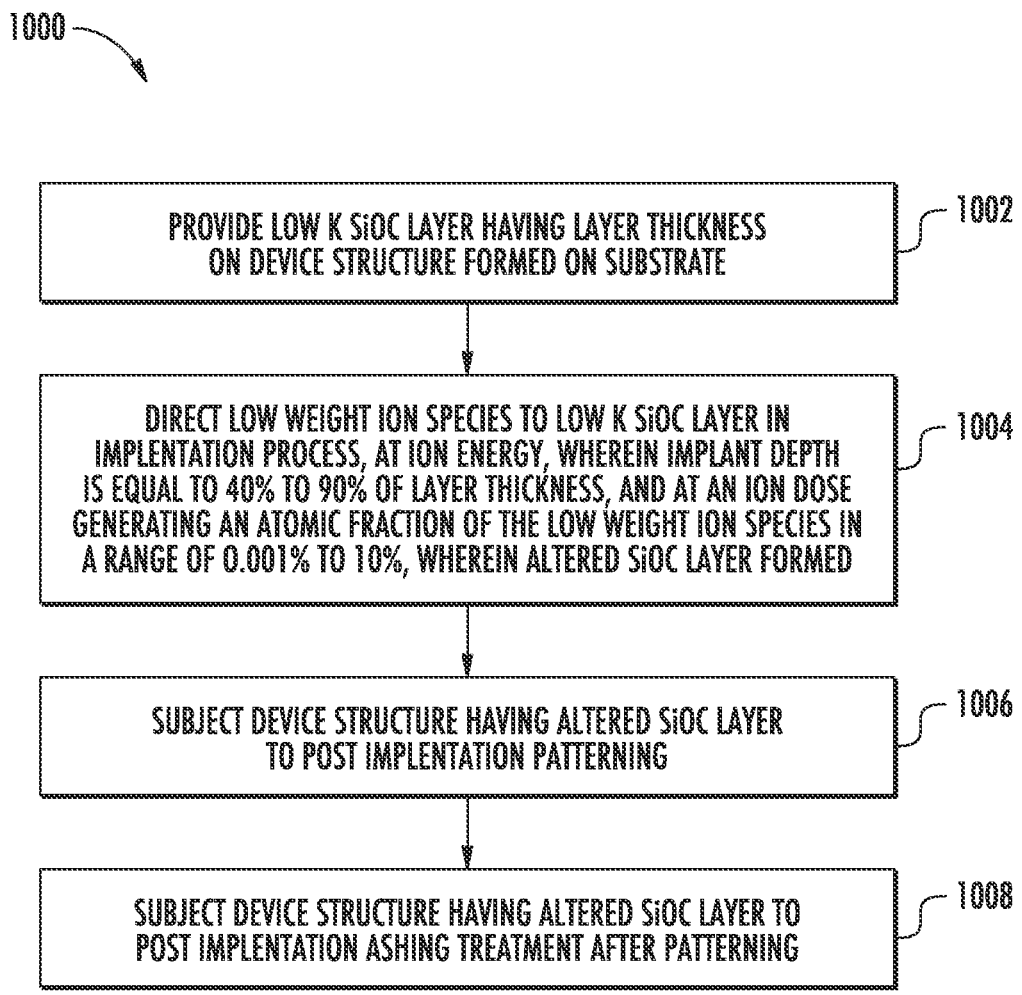
FIG. 10 depicts an exemplary process flow.

Turning now to FIG. 10, there is shown a process flow 1000, according to some embodiments of the disclosure. At block 1002, a low k SiOC layer having a layer thickness is provided on a device structure formed on a substrate. The layer thickness may be an average layer thickness where the low k SiOC layer may be formed upon three dimensional structures. The device structure may represent any suitable device, at a stage where processing is not complete. The device structure may include, for example, conductive elements, including metal lines, liners, vias, or other structures. As such, the low k SiOC layer may provide electrical decoupling between different conductive elements of the device structure.

According to different embodiments, the low k SiOC layer may be layer formed by CVD, such as using a known FCVD process.

At block 1004, an ion implantation process is performed to direct a low weight ion species, such as Helium, Carbon, Nitrogen or Silicon to the low k SiOC layer, at a suitable ion energy, where the implant depth of the low weight ion species is equal to 40% to 90% of the layer thickness. Examples of suitable ion energy include an ion energy in the range of 500 eV to 15000 eV, depending upon the layer thickness of the low k SiOC layer. The ion dose of the low weight ion species may be such that an atomic fraction of the low weight ion species is in a range of 0.001% to 10%, based upon a ratio of the ion dose to the elements of the low k SiOC layer. As such, an altered SiOC layer formed.

In some examples, the low weight ion species may be helium, carbon, nitrogen or silicon ions. In some examples, the implantation process may be performed by a beamline ion implanter, or may be alternatively performed in a PLAD type apparatus.

At block 1006, the device structure is subjected to patterning after the implantation process has been performed. The patterning may be performed to form further device features within the substrate. As such, the patterning may involve known lithographic processes including deposition of patterning layers, imaging, etching, and/or other known processes.

At block 1008, the device structure having the altered SiOC layer is subjected to ashing treatment after the patterning operation of block 1006 is performed. By virtue of the implantation process performed at block 1004, the device structure, including the altered SiOC layer, may be less susceptible to increases in dielectric constant or increased leakage, and may improve breakdown voltage.

In sum, various provide the advantage of avoiding development of new materials systems and deposition processes to address the degraded performance of known FCVD layers after patterning and ashing treatment. Embodiments of the present disclosure also provide the additional advantage of a high throughput solution to improving FCVD film performance, due to the relatively low ion dose needed to improve layer properties, when performed at elevated temperatures.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
providing a substrate having a plurality of patterned features disposed directly on a first surface of the substrate, and a low dielectric constant layer disposed directly on and between the patterned features, the low dielectric constant layer characterized by a layer thickness;
heating the substrate to a substrate temperature in a range of 200° C. to 550° C.; and
directing an ion implant treatment to the low dielectric constant layer, while the substrate temperature is in the range of 200° C. to 550° C., wherein the ion implant treatment comprises:
implanting a low weight ion species, at an ion energy generating an implant depth equal to 40% to 175% of the layer thickness.

2. The method of claim 1, wherein the ion implant treatment comprises:
implanting the low weight ion species, at an ion dose generating a peak atomic fraction of the low weight ion species in a range of 0.001% to 10%.

3. The method of claim 1, wherein the directing the ion implant treatment takes place after the low dielectric constant layer is formed on the substrate, and before further processing of the substrate takes place.

4. The method of claim 1, wherein the low dielectric constant layer comprises SiOC.

5. The method of claim 4, wherein the low dielectric constant layer is formed using a flowable chemical vapor deposition (FCVD) process.

6. The method of claim 4, wherein a composition of the low dielectric constant layer is represented by $Si_xC_yO_zH_a$, where x=(10-50%), y=(5-30%), and z=(30-70%) a=(5-35%).

7. The method of claim 1, wherein the low weight ion species comprises helium.

8. The method of claim 1, wherein the substrate temperature is between 200° C. and 400° C.

9. The method of claim 1, wherein the ion implant treatment is performed in a beamline ion implanter or in a plasma deposition apparatus.

10. The method of claim 1, wherein the ion implant treatment comprises:
implanting helium ions at an ion energy generating an implant depth equal to 40% to 90% of the layer thickness.

11. A method, comprising:
providing a substrate having a plurality of patterned features disposed directly on a first surface of the substrate, and a low dielectric constant SiOC layer disposed directly on and between the patterned features, the low dielectric constant SiOC layer characterized by a layer thickness;
heating the substrate to a substrate temperature in a range of 200° C. to 550° C.; and
directing a helium ion implant treatment to the low dielectric constant SiOC layer, while the substrate temperature is in the range of 200° C. to 550° C., wherein the helium ion implant treatment comprises: implanting helium ions at an ion dose generating a peak atomic fraction of helium in a range of 0.1% to 10% with respect to elements of the low dielectric constant SiOC layer.

12. The method of claim 11, wherein the helium ion implant treatment comprises:
implanting helium ions at an ion energy generating an implant depth equal to 40% to 90% of the layer thickness.

13. The method of claim 12, wherein the ion energy is between 500 eV and 5000 eV.

14. The method of claim 11, wherein the directing the helium ion implant treatment takes place after the low dielectric constant SiOC layer is formed on the substrate, and before further processing of the substrate takes place.

15. The method of claim 11, wherein the low dielectric constant SiOC layer is formed using a flowable chemical vapor deposition (FCVD) process.

16. The method of claim 11, wherein a composition of the low dielectric constant SiOC layer is represented by $Si_xC_yO_zH_a$, where x=(10-50%), y=(5-30%), and z=(30-70%) a=(5-35%).

17. The method of claim 11, wherein the substrate temperature is between 350° C. and 400° C.

18. The method of claim 11, wherein the helium ion implant treatment is performed in a beamline ion implanter or in a plasma deposition apparatus.

19. A method, comprising:
providing a substrate having a plurality of patterned features disposed directly on a first surface of the substrate, and an SiOC layer disposed directly on and between the patterned features, the SiOC layer characterized by a layer thickness;
heating the substrate to a substrate temperature in a range of 200° C. to 550° C.; and
directing an ion implant treatment to the SiOC layer, while the substrate temperature is in the range of 200° C. to 550° C., wherein the ion implant treatment comprises:
implanting helium ions at an ion energy generating an implant depth equal to 40% to 175% of the layer thickness, and at an ion dose generating a peak atomic fraction of helium in a range of 0.1% to 10% with respect to elements of the SiOC layer.

* * * * *